United States Patent
Hsieh et al.

(10) Patent No.: US 8,772,791 B2
(45) Date of Patent: Jul. 8, 2014

(54) LIGHT-EMITTING DEVICE

(71) Applicant: Epistar Corporation, Hsinchu (TW)

(72) Inventors: Min-Hsun Hsieh, Hsinchu (TW);
Shih-Pang Chang, Hsinchu (TW);
Hung-Chih Yang, Hsinchu (TW);
Ta-Cheng Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/630,868

(22) Filed: Sep. 28, 2012

(65) Prior Publication Data

US 2013/0082238 A1    Apr. 4, 2013

(30) Foreign Application Priority Data

Sep. 29, 2011  (TW) .............................. 100135444 A

(51) Int. Cl.
*H01L 27/15* (2006.01)
*H01L 33/06* (2010.01)
*H01L 33/08* (2010.01)
*H01L 33/32* (2010.01)

(52) U.S. Cl.
CPC ................ *H01L 33/06* (2013.01); *H01L 33/08* (2013.01); *H01L 33/32* (2013.01)
USPC ................... 257/79; 257/81; 257/99

(58) Field of Classification Search
USPC .............................. 257/79, 81, 99
See application file for complete search history.

(56) References Cited

U.S. PATENT DOCUMENTS

| 5,553,090 A | 9/1996 | Yamada |
| 6,995,389 B2 | 2/2006 | Kim et al. |
| 2008/0315179 A1* | 12/2008 | Kim et al. ........................ 257/13 |
| 2012/0112162 A1* | 5/2012 | Shin ................................ 257/13 |
| 2013/0001512 A1* | 1/2013 | Kotani ............................. 257/13 |
| 2013/0170174 A1* | 7/2013 | Chou et al. ....................... 362/84 |

* cited by examiner

*Primary Examiner* — David Vu
*Assistant Examiner* — Brandon Fox
(74) *Attorney, Agent, or Firm* — Patterson & Sheridan, LLP

(57) ABSTRACT

Disclosed is a light-emitting device, comprising: a first multi-quantum well structure comprising a plurality of first well layers and a first barrier layer stacked alternately, wherein the energy gap of the first barrier layer is larger than that of any one of the first well layers; a second multi-quantum well structure comprising a plurality of second well layers and a second barrier layer stacked alternately, wherein the energy gap of the second barrier layer is larger than that of any one of the second well layers; and a third barrier layer disposed between the first multi-quantum well structure and the second multi-quantum well structure, and the third barrier layer connected with the first well layer and the second well layer, wherein the energy gap of the third barrier layer is larger than that of any one of the first well layers and the second well layers, and the thickness of the third barrier layer is larger than that of any one of the first barrier layer and the second barrier layer.

19 Claims, 11 Drawing Sheets

LIGHT-EMITTING DEVICE

CROSS REFERENCE TO RELATED APPLICATION

This application claims priority to Taiwan Patent Document No. 100135444, filed on Sep. 29, 2011 with the Taiwan Patent Office, which disclosure is hereby incorporated by reference in its entirety and made a part of this specification.

TECHNICAL FIELD

The application relates to a light-emitting device, and more particular to a light-emitting device with an improved luminous efficiency.

DESCRIPTION OF BACKGROUND ART

For a conventional light-emitting diode (LED) structure, the device efficiency rises as the operating current increases, but when the operating current increases and reaches a certain value, the device efficiency declines. Such efficiency declination phenomenon is called "efficiency droop". As shown in FIG. 1, the external quantum efficiency of the LED device reaches the highest point at a current density of about 10 A/cm$^2$, and when the current density increases, the external quantum efficiency of the device declines dramatically. This efficiency droop phenomenon limits the efficiency of the LED under a large current.

The cause of this efficiency droop phenomenon is still inconclusive, but it is generally believed that it is due to the mismatch of mobility of the electrons and holes in a high-current operation, so the electrons in the multi-quantum well (MQW) of the light-emitting layer overflows easily to the p-type semiconductor layer, and electrons are unevenly distributed in the multi-quantum well. Most of the electrons are concentrated in one or several quantum wells near the p-type semiconductor layer, so the holes that are injected into the light-emitting layer are insufficient, and the device efficiency declines in a high-current operation.

To solve the problem of the uneven distribution of carriers in the multi-quantum well of the light-emitting layer, a super-lattice active layer is adopted. That is, the thickness of the barrier layer in the multi-quantum well structure of the light-emitting layer is designed to be thin. When the thickness of the barrier layer is so thin that the electrons and holes are able to tunnel through the barrier layer because of the formation of the mini-band in the principles of quantum mechanics, a more uniform distribution of carriers is achieved, which is helpful to solve the above-mentioned efficiency droop problem.

SUMMARY OF THE DISCLOSURE

Disclosed is a light-emitting device, comprising: a first multi-quantum well structure comprising a plurality of first well layers and a first barrier layer stacked alternately, wherein the energy gap of the first barrier layer is larger than that of any one of the first well layers; a second multi-quantum well structure comprising a plurality of second well layers and a second barrier layer stacked alternately, wherein the energy gap of the second barrier layer is larger than that of any one of the second well layers; and a third barrier layer disposed between the first multi-quantum well structure and the second multi-quantum well structure, and the third barrier layer connected with the first well layer and the second well layer, wherein the energy gap of the third barrier layer is larger than that of any one of the first well layers and the second well layers, and the thickness of the third barrier layer is larger than that of any one of the first barrier layer and the second barrier layer.

DETAILED DESCRIPTION OF PREFERRED EMBODIMENTS

Figure 1:
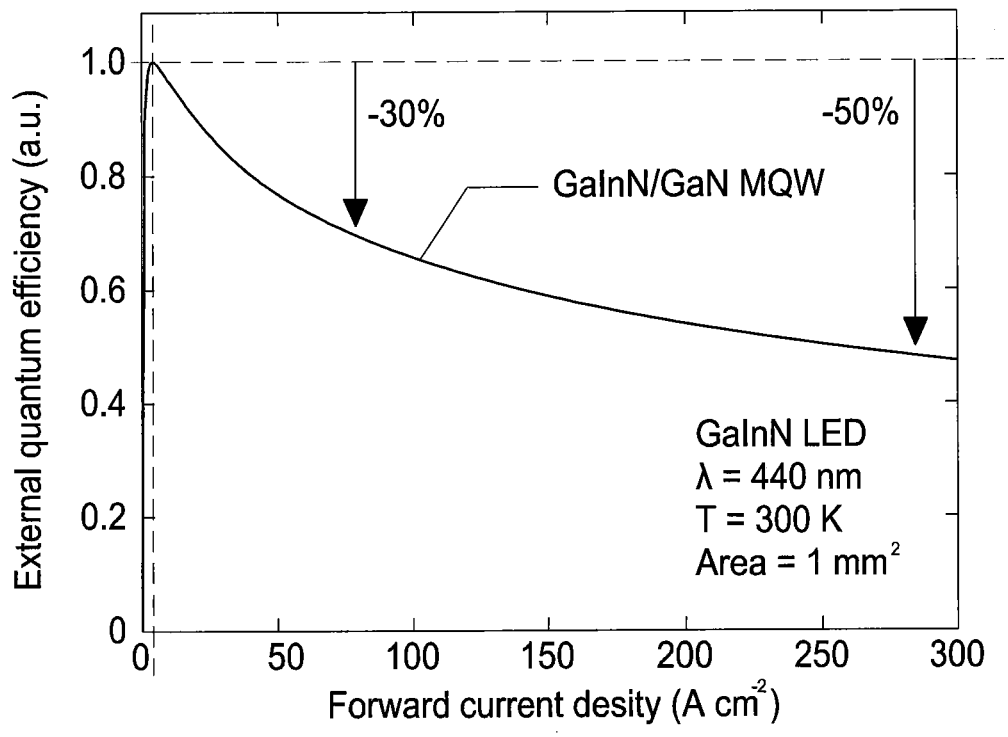
FIG. 1 illustrates the efficiency droop phenomenon of a conventional LED structure.
Figure 2:
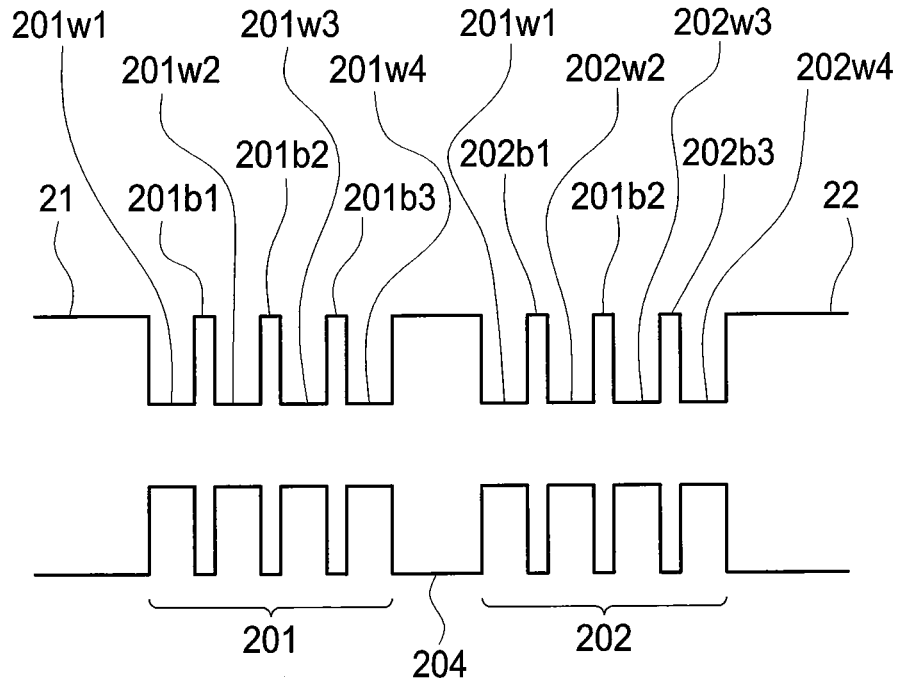
FIG. 2 illustrates the schematic diagram of the energy band gap in accordance with the first embodiment of the present application.

FIG. 2 shows the schematic diagram of the energy band gap of a composite super-lattice structure light-emitting layer in accordance with the first embodiment of the present application. The schematic diagram of the energy band gap in this embodiment shows a composite super-lattice structure light-emitting layer comprising a first super-lattice structure light-emitting layer group 201, a second super-lattice structure light-emitting layer group 202, and a spacer barrier layer 204 disposed between the two super-lattice structure light-emitting layer groups 201, 202. The composite super-lattice structure light-emitting layer may be disposed between a first conductivity type semiconductor layer 21 and a second conductivity type semiconductor layer 22 to form a light-emitting device. The first conductivity type semiconductor layer 21 and the second conductivity type semiconductor layer 22 have different conductivity type, for example, the first conductivity type semiconductor layer 21 is an n-type semiconductor layer and the second conductivity type semiconductor layer 22 is a p-type semiconductor layer. In this embodiment, the first super-lattice structure light-emitting layer group 201 comprises four well layers, i.e., the well layer 201w1, 201w2, 201w3, and 201w4, and every two adjacent well layers is separated by a thin barrier layer such as 201b1, 201b2, and 201b3, wherein the energy gaps of the thin barrier layer 201b1, 201b2, and 201b3 are larger than those of the well layer 201w1, 201w2, 201w3, and 201w4. By adjusting the energy gaps of the well layer 201w1, 201w2, 201w3, and 201w4, the first super-lattice structure light-emitting layer group 201 can emit light having a first dominant wavelength. The second super-lattice structure light-emitting layer group 202 comprises four well layers, i.e., the well layer 202w1, 202w2, 202w3, and 202w4, and each two adjacent well layers are separated by a thin barrier layer such as 202b1, 202b2, and 202b3, wherein the energy gaps of the thin barrier layer 202b1, 202b2, and 202b3 are larger than those of the well layer 202w1, 202w2, 202w3, and 202w4. By adjusting the energy gaps of the well layer 202w1, 202w2, 202w3, and 202w4, the second super-lattice structure light-emitting layer group 202 can emit light having a second dominant wavelength. The second dominant wavelength may be the same as or different from the first dominant wavelength. Each of the two adjacent super-lattice structure light-emitting layer groups has a well layer closer to the spacer barrier layer 204 and connecting with the spacer barrier layer 204. For example, the first super-lattice structure light-emitting layer group 201 has a well layer 201w4 closer to the spacer barrier layer 204 and connecting with the spacer barrier layer 204, and the second super-lattice structure light-emitting layer group 202 has a well layer 202w1 closer to the spacer barrier layer 204 and connecting with the spacer barrier layer 204, wherein the energy gap of the spacer barrier layer 204 is larger than those of the well layers of the first super-lattice structure light-emitting layer group 201 and the well layers of the second super-lattice structure light-emitting layer group 202. Regarding the choice of the material, the materials represented by $Al_xIn_yGa_{(1-x-y)}N$ ($0 \leq x \leq 1$, $0 \leq y \leq 1$, $0 \leq x+y \leq 1$) can be chosen as the material of any layer in the above-mentioned composite super-lattice structure light-emitting layer. For example, the material of the well layers in this embodiment is InGaN, and the material of the thin barrier layers and the spacer barrier layer is GaN. Since the first super-lattice structure light-emitting layer group 201 and the second super-lattice structure light-emitting layer group 202 are both multi-quantum well light-emitting layer of the super-lattice structure, the thicknesses of thin barrier layer 201b1, 201b2, 201b3, 202b1, 202b2, and 202b3 are all thin enough for electrons and holes to tunnel through. The spacer barrier layer 204 is like a common barrier layer in the multi-quantum well structure. That is, its thickness is at a certain level that the electrons and holes can not tunnel through. In other words, the thicknesses of the thin barrier layer 201b1, 201b2, 201b3, 202b1, 202b2, and 202b3 are all less than the thickness of the spacer barrier layer 204. The thickness for electrons and holes to tunnel through is different by materials, for example, when GaN is used as the materials of the thin barrier layer 201b1, 201b2, 201b3, 202b1, 202b2, and 202b3 and spacer barrier layer 204, the thickness for electrons and holes to tunnel through is generally less than about 5 nm. When the thickness is equal to or greater than about 5 nm, electrons and holes can not tunnel through. In this embodiment, the thicknesses of the thin barrier layer 201b1, 201b2, 201b3, 202b1, 202b2, and 202b3 are about 3 nm, while the thickness of the spacer barrier layer 204 is about 8 nm.

It is noted that although only two super-lattice structure light-emitting layer groups are illustrated in this embodiment, the composite super-lattice structure light-emitting layer of the present application may be formed with a combination of a plurality of super-lattice structure light-emitting layer groups, and not limited to two groups, and a spacer barrier layer is disposed between each two adjacent super-lattice structure light-emitting layer groups. For different spacer barrier layers, the thicknesses can be the same or different, but all the thicknesses should not be able to be tunneled though by electrons and holes. Each super-lattice structure light-emitting layer group comprises a plurality of well layers, and every two adjacent well layers are separated by a thin barrier layer. That is, each super-lattice structure light-emitting layer group comprises a plurality of well layers and at least one thin barrier layer stacking alternately. The thicknesses of the thin barrier layers in the same super-lattice structure light-emitting layer group can be the same or different, but all the thicknesses must allow electrons and holes to tunnel through. The thicknesses of the thin barrier layers in different super-lattice structure light-emitting layer groups can be the same or different. The materials of the thin barrier layers in the same or different super-lattice structure light-emitting layer groups can be the same or different. In addition, the number of the well layers in each super-lattice structure light-emitting layer group can be the same or different.

Figure 3A:
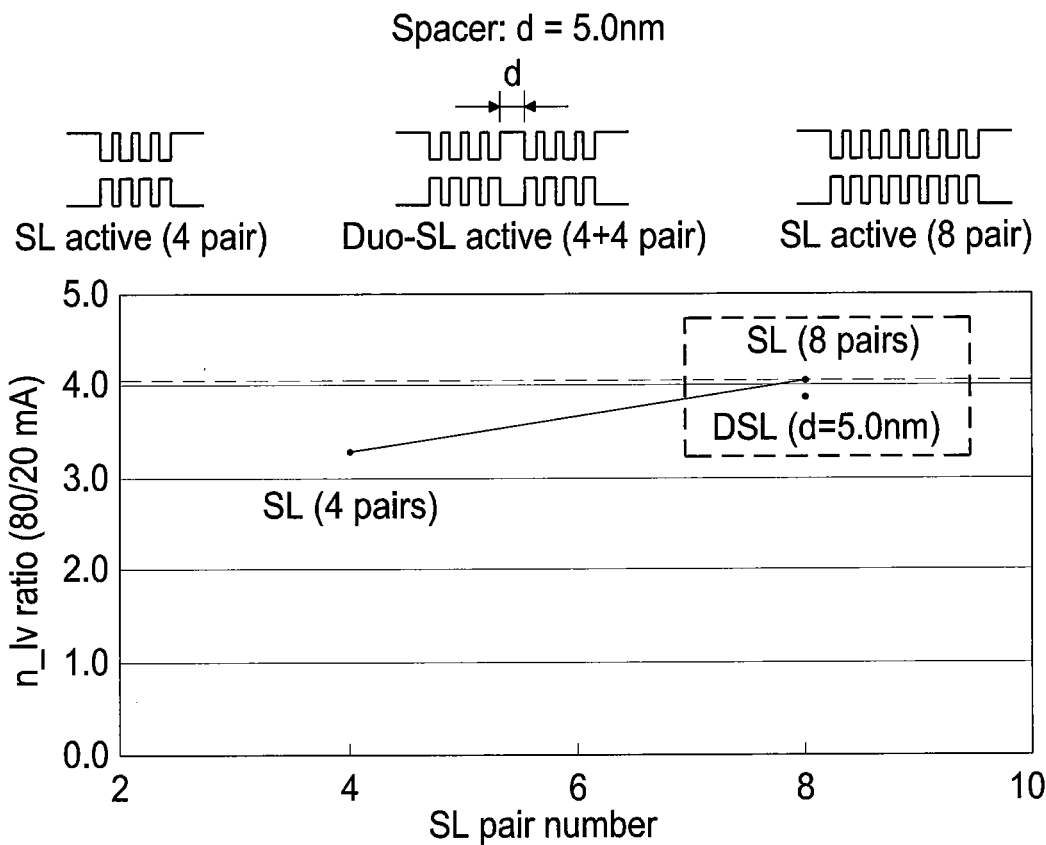
FIG. 3A illustrates the effect of the present application on solving the efficiency droop problem.
Figure 3B:
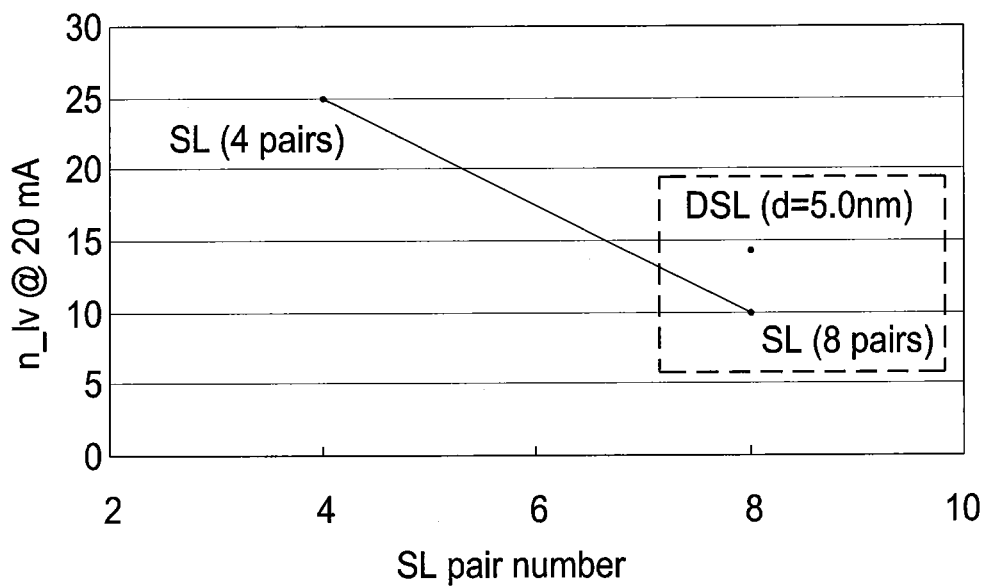
FIG. 3B illustrates the effect of the present application on solving the efficiency droop problem.

FIG. 3A illustrates the effect of the composite super-lattice structure light-emitting layer disclosed in an embodiment of the present application. The upper part of FIG. 3A illustrates the schematic diagrams of the energy band gap of three different structures of the light-emitting layers. The left is a conventional super-lattice structure light-emitting layer comprising 4 well layers (SL Active (4pair)). The middle illustrates a composite super-lattice structure light-emitting layer comprising two super-lattice structure light-emitting layer groups (Duo-SL active (4+4pair), DSL) as shown in FIG. 2. The thickness of the spacer barrier layer in the middle is represented by d, which is 5 nm in the present embodiment. The right is the conventional super-lattice structure light-emitting layer comprising 8 well layers (SL active (8pair)). The lower part of FIG. 3A shows the ratio of the axial luminous intensity in the high current of 80 mA and the low current of 20 mA (n_lv ratio (80/20 mA), vertical axis) of the three different light-emitting layer structures. It can be seen from the figure that for the conventional super-lattice structure light-emitting layer comprising 4 well layers (marked by SL (4pair)), when the operating current increases from the low current of 20 mA to the high current of 80 mA, i.e., with a four times increase, the ratio of the axial luminous intensity is about 3.3. In other words, when the operating current increases four times, the luminous intensity does not increase with the same. This shows there is an efficiency droop problem. The composite super-lattice structure light-emitting layer in this embodiment (marked by DSL (d=5.0 nm)) has an luminous intensity performance like that of the conventional super-lattice structure light-emitting layer comprising 8 well layers, and the value of the ratio of the axial luminous intensity of both increases in proportion to the increase of operating current, which is about 4. This shows the efficiency droop problem is solved. A further comparison of the above-mentioned two light-emitting layers shows that although both the composite super-lattice structure light-emitting layer in this embodiment of present application (marked by DSL (d=5.0 nm)) and the conventional super-lattice structure light-emitting layer comprising 8 well layers can solve the efficiency droop problem, it can be seen that in the low current of 20 mA, as shown in FIG. 3B, the performance of the axial luminous intensity (n_lv@20 mA, vertical axis) of the conventional super-lattice structure light-emitting layer comprising 8 well layers is significantly inferior to that of the composite super-lattice structure light-emitting layer. Compared with the conventional super-lattice structure, the composite super-lattice structure light-emitting layer in this embodiment not only solves the efficiency droop problem under the high operating current, but also provides good luminous intensity under the low operating current. The efficiency under both the high and low operating current is satisfied.

Figure 4:
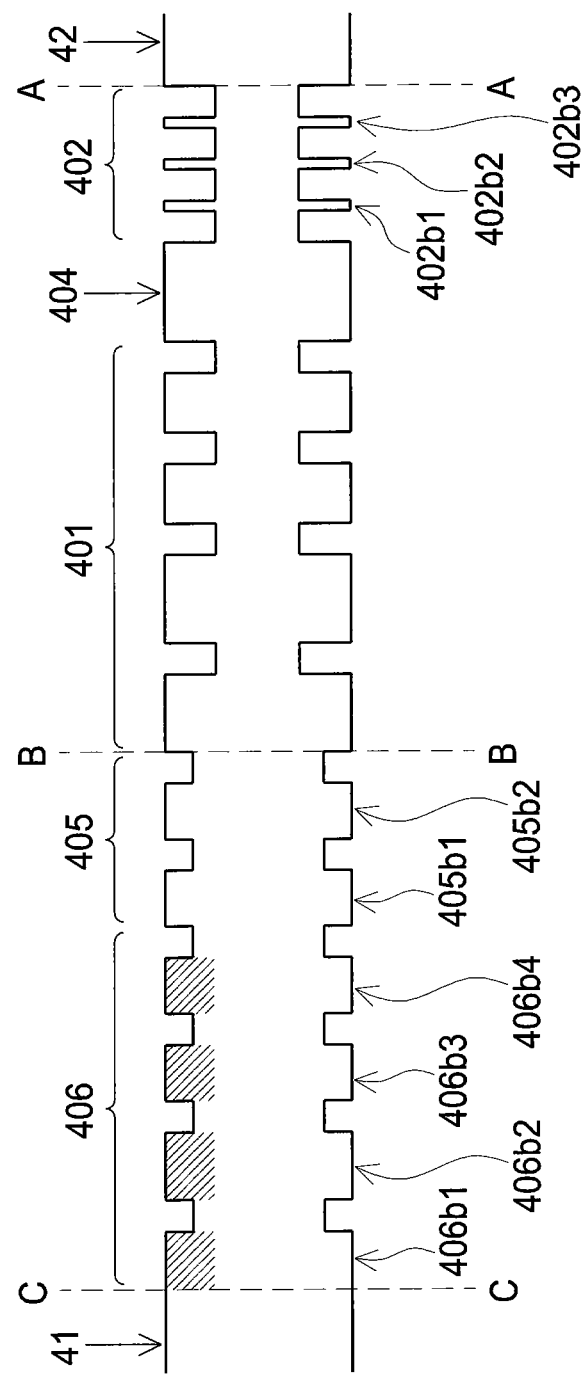
FIG. 4 illustrates the schematic diagram of the energy band gap in accordance with the second embodiment of the present application.

The second embodiment of the present application discloses the above illustrated composite super-lattice structure light-emitting layer accompanied by an electron energy suppressing structure, which can further raise the operating efficiency under a low current. FIG. 4 is the schematic diagram of the energy band gap in accordance with the second embodiment of the present application, wherein a composite super-lattice structure light-emitting layer is shown between line AA and line BB, and an electron energy suppressing structure which comprises an un-doped structure 405 and a doped structure 406 is shown between line BB and line CC. In the present embodiment, the un-doped structure 405 is configured with two un-doped structure sets, wherein each un-doped structure set comprises a suppressing well layer and an un-doped suppressing barrier layer. The first un-doped structure set comprises the suppressing well layer 405$w$1 and the un-doped suppressing barrier layer 405$b$1, and the second un-doped structure set comprises the suppressing well layer 405$w$2 and the un-doped suppressing barrier layer 405$b$2, wherein the energy gap of each suppressing well layer is greater than that of the well layer of composite super-lattice structure light-emitting layer, and for each un-doped structure set, the energy gap of the un-doped suppressing barrier layer thereof is larger than that of the suppressing well layer thereof. And the word "un-doped" in the un-doped suppressing barrier layers here refers to a general meaning which comprises "no impurity doped" or "unintentionally doped". That is, no impurity is intentionally added during the growing process of the layer ("no impurity doped"), but a slight amount of impurities such as silicon atoms may still come from contamination such as the machine in the process ("unintentionally doped"), with a concentration generally less than $1 \times 10^{17}$ (/cm$^3$). In the present embodiment, the doped structure 406 is n-type doped (n-doped) and configured with four n-doped structure sets, wherein each n-doped structure set comprises a suppressing well layer and a suppressing barrier layer, and one of the suppressing well layer and the suppressing barrier layer is n-doped. In this embodiment, the first n-doped structure set comprises the suppressing well layer 406$w$1 and the n-doped suppressing barrier layer 406$b$1. Similarly, the suppressing well layers 406$w$2, 406$w$3, and 406$w$4, and their corresponding n-doped suppressing barrier layers 406$b$2, 406$b$3, and 406$b$4, constitute the second to fourth n-doped structure set, respectively, wherein the energy gap of the suppressing well layer is larger than that of the well layer of the composite super-lattice structure light-emitting layer. For each n-doped structure set, the energy gap of the n-doped suppressing barrier layer is larger than that of the suppressing well layer. The word "doped" means the impurities such as silicon atoms are intentionally added during the growing process of the layer, with a concentration generally larger than $1 \times 10^{17}$ (/cm$^3$). Regarding the choice of the material, the materials represented by $Al_xIn_yGa_{(1-x-y)}N$ ($0 \leq x \leq 1$, $0 \leq y \leq 1$, $0 \leq x+y \leq 1$) can be chosen as the material. In the present embodiment, the material of the suppressing well layers is InGaN, and the thicknesses are all 3 nm. The material of the un-doped suppressing barrier layers or the n-doped suppressing barrier layers is GaN, and the thicknesses are all 12 nm. It is noted that the electron energy suppressing structure may comprise either of the un-doped structure 405 and the doped structure 406 or both, and the un-doped structure may comprise one or more un-doped structure sets. Similarly, the doped structure may comprise one or more doped structure sets.

The electron energy suppressing structure may be disposed between a first conductivity type semiconductor layer 41 (an n-type semiconductor layer in the present embodiment) and the composite super-lattice structure light-emitting layer to suppress the energy of the electrons injected thereto, reduce the electron overflowing, solve the efficiency droop problem, and enhance the operating efficiency under a low current when combined with the composite super-lattice structure light-emitting layer. The effect is illustrated in FIG. 5 below.

The composite super-lattice structure light-emitting layer in this embodiment is shown between line AA and line BB (It is noted that the thicknesses shown by the diagram have a different scale from that for thicknesses shown between line BB and line CC). The composite super-lattice structure light-emitting layer comprises a first super-lattice structure light-emitting layer group 401, a second super-lattice structure light-emitting layer group 402, and a spacer barrier 404 disposed therebetween. The structure and the principles of the embodiment are as those illustrated in the first embodiment, and aforementioned principles are more specifically illustrated in this embodiment. In the present embodiment, different choices are made for the thicknesses of the thin barrier layers disposed in the same first super-lattice structure light-emitting layer group 401. The thin barrier layers 401$b$1 and 401$b$2 have the same thickness (4 nm), which is different from the thickness of the thin barrier layers 401$b$3 and 401$b$4 (both 3 nm). Besides, the thicknesses of the thin barrier layers disposed in different groups are also different. For example, the thicknesses of the thin barrier layers 402$b$1, 402$b$2, and 402$b$3 disposed in the second super-lattice structure light-emitting layer group 402 are all 2 nm. It is noted that the arrangement of the thicknesses of the thin barrier layers in this embodiment provides better device efficiency. That is, for a plurality of super-lattice structure light-emitting layer groups, the thicknesses of the thin barrier layers of the super-lattice structure light-emitting layer group closer to the first conductivity type semiconductor layer 41 are greater than the thicknesses of the thin barrier layers of the super-lattice structure light-emitting layer group farther from the first conductivity type semiconductor layer 41.

The composite super-lattice structure light-emitting layer together with the aforementioned electron energy suppressing structure may be disposed between a first conductivity type semiconductor layer 41 and a second conductivity type semiconductor layer 42 to from a light-emitting device, wherein the first conductivity type semiconductor layer 41 and the second conductivity type semiconductor layer 42 have different conductivity types. As mentioned previously, the first conductivity type semiconductor layer 41 is an n-type semiconductor layer and the second conductivity type semiconductor layer 42 is a p-type semiconductor layer.

Figure 5:
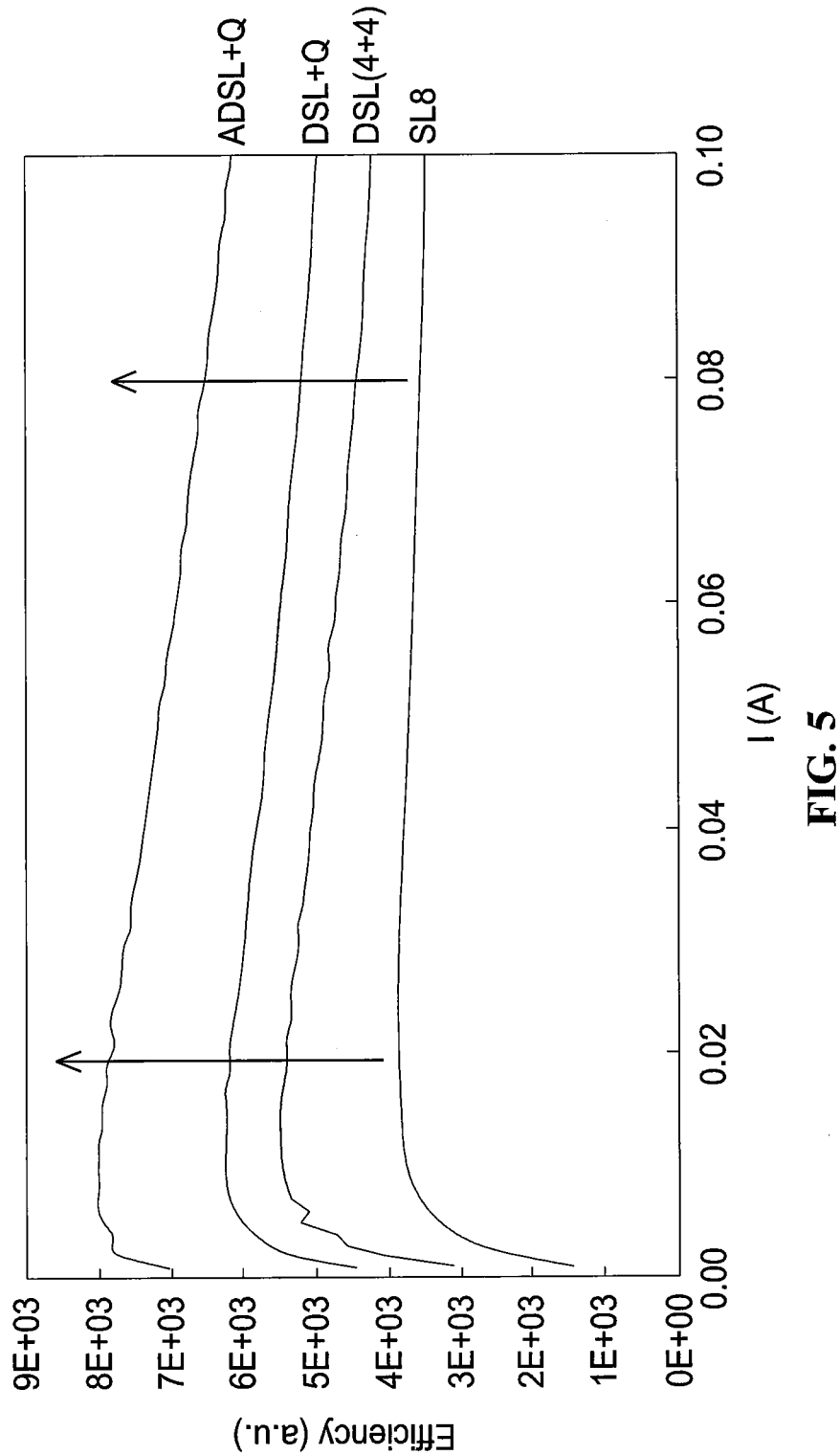
FIG. 5 illustrates a comparison of the luminous efficiency of the light-emitting device in FIG. 4 and light-emitting devices of various structures.

FIG. 5 shows a comparison of the luminous efficiency of the above light-emitting device in FIG. 4 and the light-emitting devices of various structures, the conventional super-lattice structure light-emitting layer comprising 8 well layers (marked by SL8) in particular. It can be seen from the figure that, whether in the low current or in the high current, the light-emitting device disclosed in the second embodiment above (marked by ADSL+Q) has the best performance on the luminous efficiency (vertical axis). Then the second place is the light-emitting device having the composite super-lattice structure light-emitting layer comprising two super-lattice structure light-emitting layer groups disclosed in the first embodiment with the foregoing electron energy suppressing structure (marked by DSL+Q). The third place is the light-emitting device having the composite super-lattice structure light-emitting layer comprising two super-lattice structure light-emitting layer groups disclosed in the first embodiment without the foregoing electron energy suppressing structure (marked by DSL (4+4)). The worst is the conventional super-lattice structure light-emitting layer comprising 8 well layers (marked by SL8).

So, clearly, compared with the conventional super-lattice structure, the composite super-lattice structure light-emitting layer of the present application can not only solve the efficiency droop problem under the high operating current, but also provide good luminous intensity under the low operating current. The luminous efficiency under both the high and low operating current is satisfied. And the electron energy suppressing structure of the present application can also enhance the efficiency, especially the efficiency under a low current. Therefore, compared with the conventional skill of the art, the composite super-lattice structure light-emitting layer of the present application accompanied by the electron energy suppressing structure not only solves the efficiency droop problem under a high current, but also makes the performance on luminous intensity under a low current very good.

Figure 6:
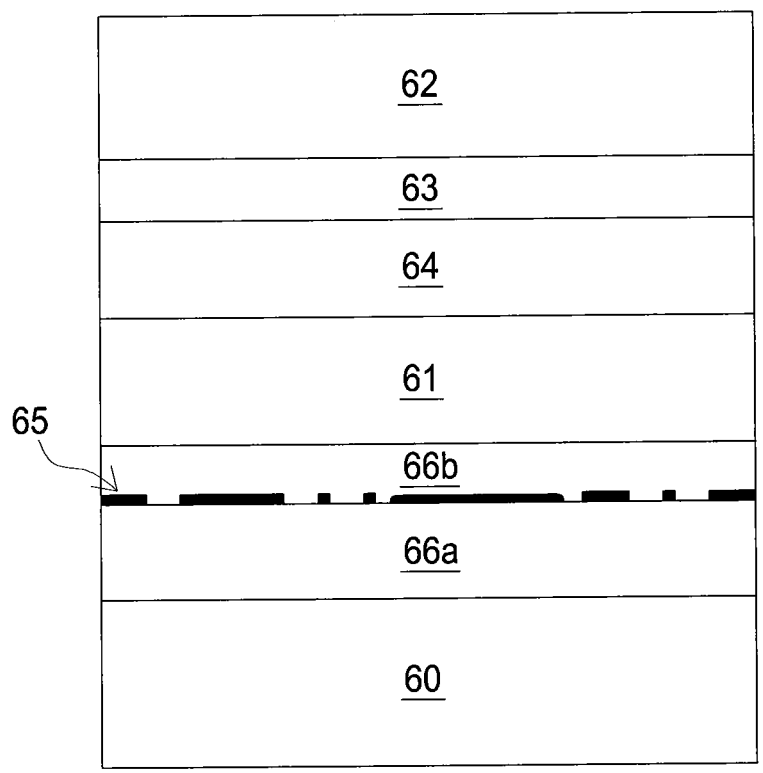
FIG. 6 illustrates the schematic diagram of the device structure of a preferred embodiment of the present application.

In addition, while the problem of efficiency droop is dealt with, the problem of decreasing of the internal quantum efficiency (IQE) often occurs. A better solution is to solve the light-emitting layer defects at the same time. As shown by the schematic diagram of the device structure of another embodiment of the present application in FIG. 6, in addition to the second conductivity type semiconductor layer 62, the composite super-lattice structure light-emitting layer 63, electron energy suppressing structure 64, and the first conductivity type semiconductor layer 61, the device comprises a substrate 60 under the first conductivity type semiconductor layer 61 and a discontinuous (i.e., scattered flakes) defect blocking layer 65 disposed between the substrate 60 and the first conductivity type semiconductor layer 61, and this defect blocking layer 65 may be, for example, silicon nitride $SiN_x$. The silicon nitride $SiN_x$ can be formed in-situ, that is, be formed in the same MOCVD equipment which grows the epitaxial layer of the light-emitting diode. As shown in FIG. 6, an un-doped GaN layer 66a is first grown on a substrate 60, and during the growing process, the gas supplied to the equipment is changed. For example, $Si_2H_6$ and $NH_3$ are supplied with a temperature about from 800° C. to 1000° C., and a pressure about from 50 torr to 760 torr to form the silicon nitride $SiN_x$ layer. And then the gas supplied is changed back to the original gas which is used to grow the un-doped GaN layer to continue the growth of the un-doped GaN layer 66b. This makes the un-doped GaN layer 66b comprise a lower defect density because of the defect blocking layer 65, and as a result also cause a reduction of the defect density of the light-emitting layer which is about $2 \times 10^8$ (/cm$^2$) generally to about $2 \times 10^8$ (/cm$^2$). Because the defect density of the light-emitting layer is decreased due to the defect blocking layer, the internal quantum efficiency (IQE) is raised. And thus the overall efficiency of the device is raised.

The composite super-lattice structure light-emitting layer or the combination of the composite super-lattice structure light-emitting layer and the electron energy suppressing structure disclosed in the present application can solve the efficiency droop problem under a high current condition. Therefore, it can be applied to a white light light-emitting device, particularly a dimmable one, to improve the known color temperature shift phenomenon caused by the efficiency droop problem in a device having a combination of blue and red LED components under a high operating current condition (for example, when the current density is greater than 20 A/cm$^2$, or when the current is greater than 350 mA for a 45 mil*45 mil chip.

Figure 7:
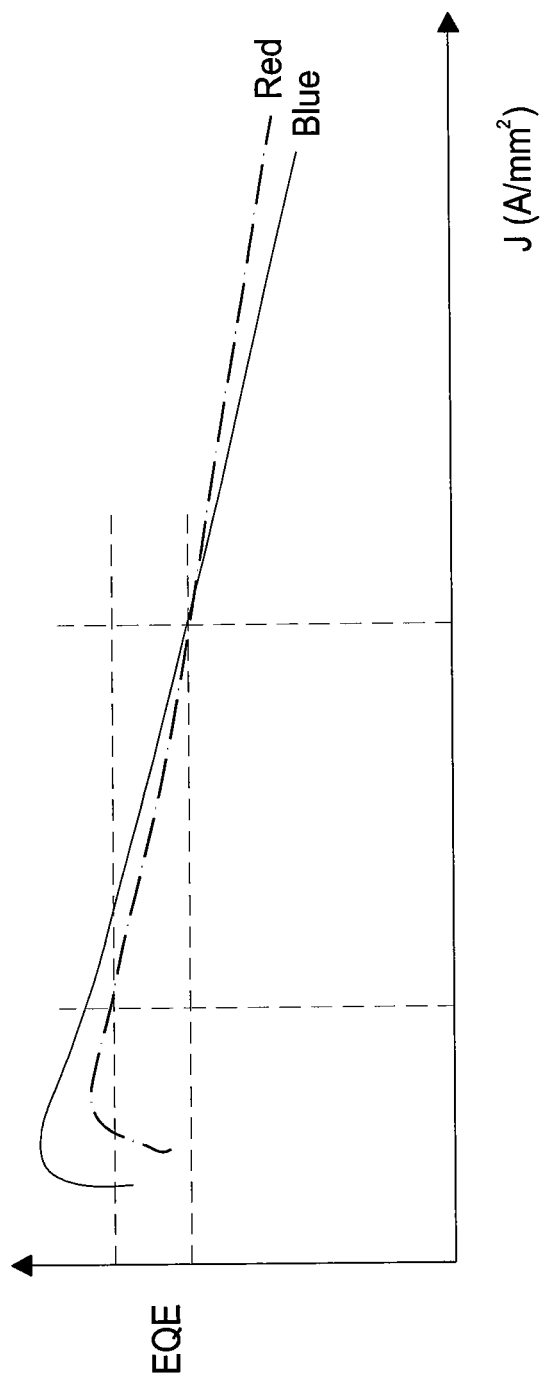
FIG. 7 illustrates the efficiency droop phenomenon of a blue LED and a red LED of a conventional LED structure.
Figure 8:
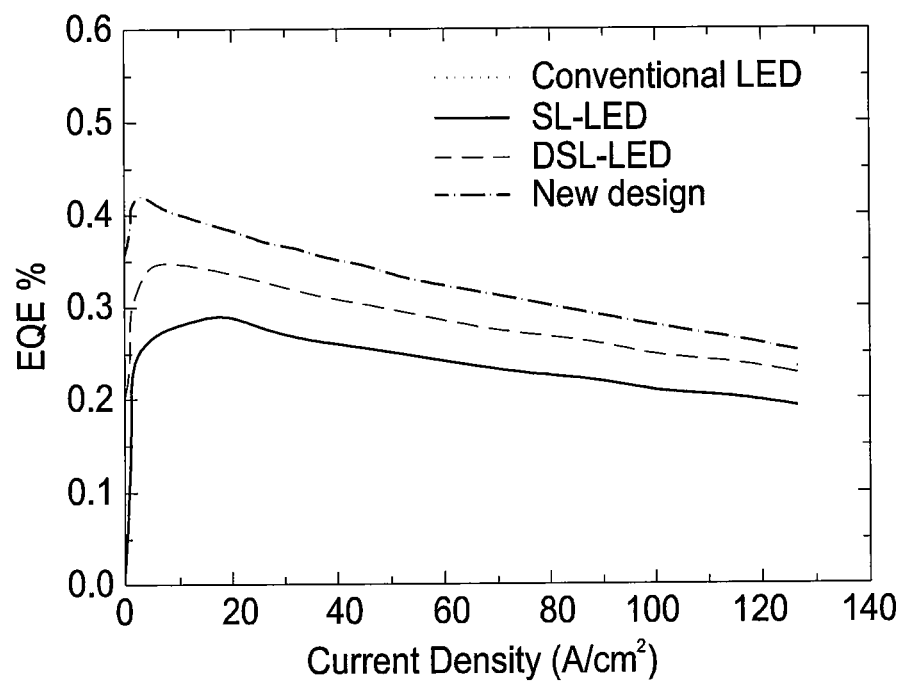
FIG. 8 illustrates the device efficiency of the blue LED component which adopts the composite super-lattice structure light-emitting layer in accordance with the present application.

As shown in FIG. 7, although a light-emitting device having a combination of blue and red LED components can generate white light by mixing different light, the color temperature of the white light changes due to the adjustment of light intensity on the application demand. It is because the efficiency droop of the blue LED element (marked by "Blue") is more significant than that of the red LED element (marked by "Red"), or in other words, the device efficiency (or the external quantum efficiency, EQE, the vertical axis) of the blue LED element declines more rapidly as the operating current (or current density) increases. For example, to adjust the light intensity from a small value to a large value, what to do is to adjust the input current of the blue and red LED elements from a small value to a large value. However, the changing rates of device efficiency (or external quantum efficiency, EQE) of the blue and red LED elements in response to the input current are different. As shown in the figure, the declining trend of the device efficiency of the blue LED element (marked by "Blue") is sharper than that of the red LED element (marked by "Red"). Thus, when the input current changes from a small value to a large value, the declining trend of the device efficiency of the blue LED element is sharper than that of the red LED element, so that the ratio of the blue light to red light is changed as the input current changes. This results in apparent changes of the color temperature of the white light formed by mixing of the blue and red light, in particular a change toward cool light, and makes the user unpleasant. Therefore, if the changing rate of device efficiency of the blue LED element in response to the input current can be controlled to be the same as that of the red LED element, the shift of the color temperature due to the adjustment of light intensity can be improved. Therefore, for a light-emitting device having a combination of blue and red LED components, the composite super-lattice structure light-emitting layer in the present application or the combination of the composite super-lattice structure light-emitting layer and the electron energy suppressing structure can be applied to the blue LED component. Under a high operating current, for example, when the current is greater than 350 mA (or when the current density is greater than 20 A/cm$^2$), the embodiments in the present application keep their device efficiency larger than 20%, or keep their internal quantum efficiency (IQE) larger than 30%. Even though efficiency droop occurs, the declining rate of device efficiency from the maximum device efficiency to the device efficiency at the current density of 75 A/cm$^2$ is smaller than 30%, and the declining rate of internal quantum efficiency from the maximum internal quantum efficiency to the internal quantum efficiency at the current density of 75 A/cm$^2$ is smaller than 30%. In FIG. 8, the device efficiency of the blue LED component which adopts the composite super-lattice structure light-emitting layer in the present application is shown. The figure shows the device efficiency of the blue LED components of four different structures: a conventional structure blue LED (marked by "Conventional LED"), the blue LED comprising the aforementioned conventional super-lattice structure light-emitting layer having 8 well layers shown in the upper right region of FIG. 3A (marked by "SL-LED"), the blue LED comprising the aforementioned composite super-lattice structure light-emitting layer shown in FIG. 2 (marked by "DSL-LED"), and the blue LED having a combination of the composite super-lattice structure light-emitting layer in FIG. 2 and the electron energy suppressing structure in FIG. 4 (marked by "New Design"). The details of their respective structures are as the previous illustration, and are not illustrated here again. It can be seen from the figure that for the two embodiments in the present application, i.e. the blue LED comprising the aforementioned composite super-lattice structure light-emitting layer shown in FIG. 2 (marked by "DSL-LED") and the blue LED having a combination of the composite super-lattice structure light-emitting layer in FIG. 2 and the electron energy suppressing structure in FIG. 4 (marked by "New Design"), their device efficiency changing rate in response to the current (or current density) is smaller and more close to that of the red LED element under a high operating current condition, for example, when the current density is greater than 20 A/cm$^2$ (when the current is greater than 350 mA for a 45 mil*45 mil chip, and when the current is greater than 210 mA for a 35 mil*35 mil chip). Therefore, as previously illustrated, they can be used to improve the color temperature shift under a high operating current condition. In particular, when the blue LED having a combination of the composite super-lattice structure light-emitting layer in FIG. 2 and the electron energy suppressing structure in FIG. 4 (marked by "New Design") is compared with the conventional structure blue LED (marked by "Conventional LED"), their device efficiency is 39% and 41% respectively at the current density of 20 A/cm$^2$, and the device efficiency is 31% and 30% respectively at the current density of 75 A/cm$^2$ (the current is 1000 mA for a 45 mil*45 mil chip, and the current is 600 mA for a 35 mil*35 mil chip). It can be seen that in addition to the aforementioned smaller device efficiency changing rate in response to the current (or current density), the blue LED having a combination of the composite super-lattice structure light-emitting layer in FIG. 2 and the electron energy suppressing structure in FIG. 4 (marked by "New Design") provides a higher device efficiency than that of the conventional structure blue LED under a high current density, for example, the aforementioned 75 A/cm$^2$. In sum, it can be seen from the figure that though an efficiency droop occurs under a high operating current, the two embodiments in the present application substantially keep their device efficiency between 22% and 42%. Taking the current density of 75 A/cm$^2$ as a reference for a further comparison, the device efficiency of the blue LED having a combination of the composite super-lattice structure light-emitting layer in FIG. 2 and the electron energy suppressing structure in FIG. 4 (marked by "New Design") declines from the maximum device efficiency 41% to 31% at the current density of 75 A/cm$^2$. The changing amount is 11%, which corresponds to a declining rate of 26% (11%/42%=26%). The blue LED comprising the aforementioned composite super-lattice structure light-emitting layer shown in FIG. 2 (marked by "DSL-LED") substantially keeps its device efficiency between 22% and 35%. Its device efficiency declines from the maximum device efficiency 35% to 25% at the current density of 75 A/cm$^2$. The changing amount is 10%, which corresponds to a declining rate of 29% (10%/35%=29%). In contrast, for the conventional structure blue LED (marked by "Conventional LED"), its device efficiency declines from the maximum device efficiency 55% to 30% at the current density of 75 A/cm$^2$. The changing amount is 25%, which corresponds to a declining rate of 45% (25%/55%=45%). It can be seen that the efficiency droop is significantly improved in the embodiments in the present application so the color temperature shift due to the adjustment of light intensity is alleviated. It is noted that all the blue LEDs of the structures in this figure are non-packaged LEDs, and the light extraction rate is 0.63. So for the device efficiency of 22%, the corresponding internal quantum efficiency (IQE) is 35% (22%/0.63=35%). In other words, under a high operating current condition, for example, when the current density is greater than 20 A/cm$^2$, the embodiments in the present application have device efficiency larger than 22%, or their internal quantum efficiency (IQE) is larger 35%. And though an efficiency droop occurs, their declining rate of device efficiency from the maximum device efficiency to the device efficiency at the current density of 75 A/cm$^2$ is smaller than 30%, and the declining rate of internal quantum efficiency from the maximum internal quantum efficiency to the internal quantum efficiency at the current density of 75 A/cm$^2$ is smaller than 30%.

Figure 9:
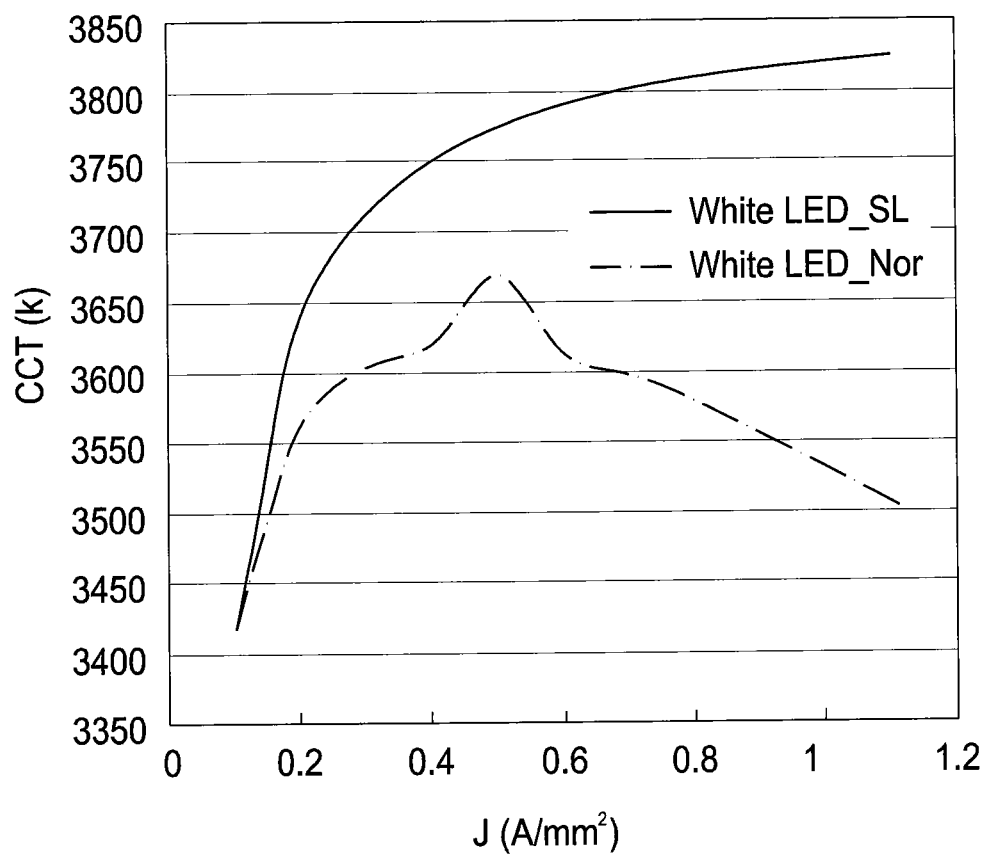
FIG. 9 shows the comparison of color temperature trends of the light-emitting devices under different operating current densities: the light-emitting device formed by a combination of the blue LED in accordance with the present application and a red LED, and the light-emitting device formed by the identical red LED and a conventional structure blue LED.
Figure 10A:
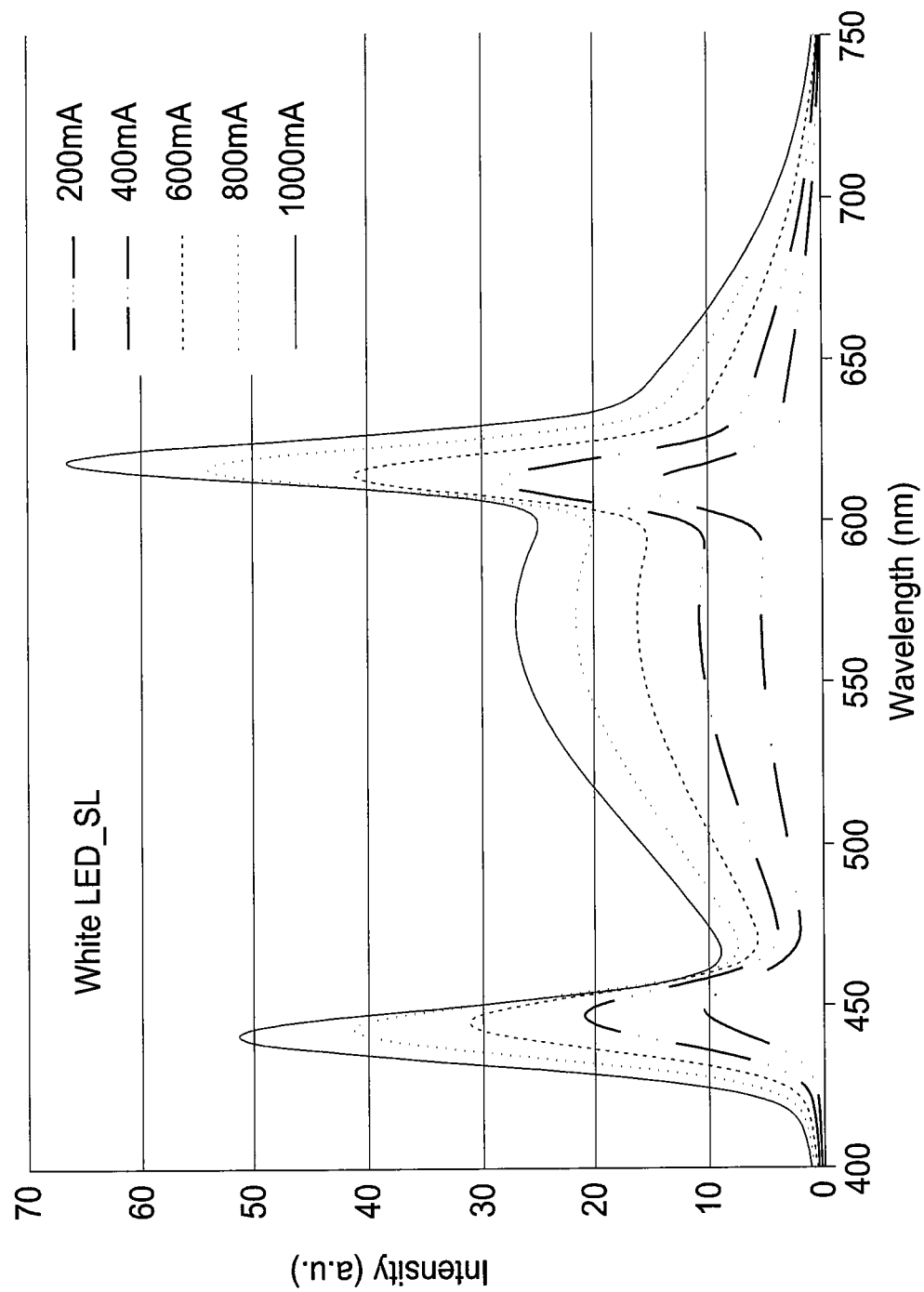
FIG. 10A shows the light intensity versus wavelength chart of the device formed by a combination of the blue LED in accordance with the present application and the red LED illustrated in FIG. 9 under different operating currents.
Figure 10B:
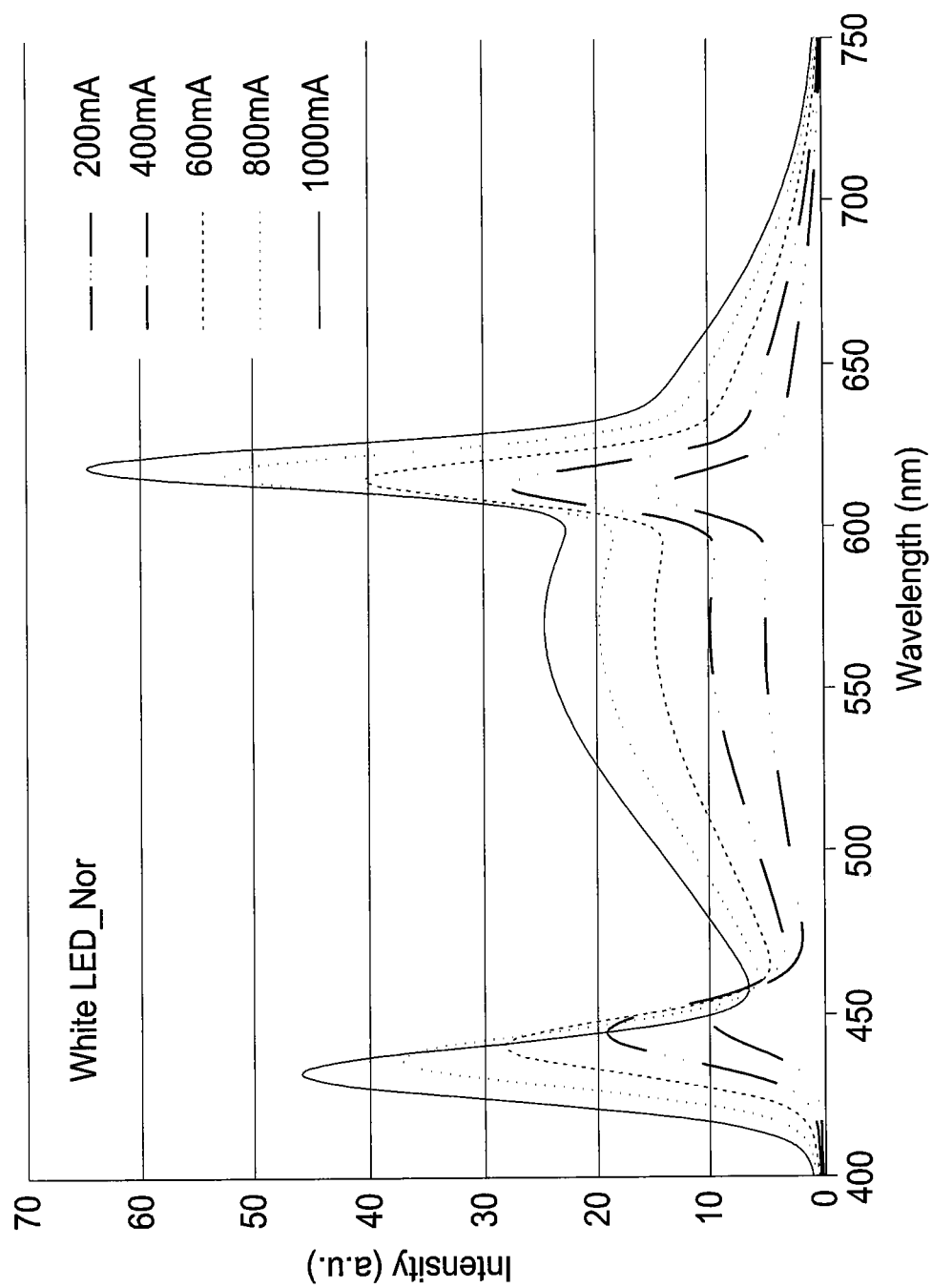
FIG. 10B shows the light intensity versus wavelength chart of the device formed by a combination of the conventional structure blue LED and the red LED illustrated in FIG. 9 under different operating currents.

FIG. 9 shows the comparison of color temperature trend of the light-emitting devices under different operating current density. One of the light-emitting devices is a light-emitting device (marked by White LED_SL) having a combination of a red LED element and the aforementioned blue LED in FIG. 8 having a combination of the composite super-lattice structure light-emitting layer in FIG. 2 and the electron energy suppressing structure in FIG. 4, and the other is a light-emitting device (marked by White LED_Nor) having the identical red LED element and the aforementioned conventional structure blue LED shown in FIG. 8. Both of the above blue LEDs are covered by the same phosphors. The phosphor is, for example, a yellow phosphor. A part of blue light from the blue LED passes through the phosphor, and another part of blue light from the blue LED is absorbed by the phosphor to excite the phosphor to generate an excited light. The blue LED comprises GaN-based material. The red LED comprises GaP-based material. All the experimental conditions (for example, the phosphors on the blue LEDs, and the red LED element) except the blue LEDs and measuring conditions for these two trend curves are identical, so that the results of color temperature shift for the LED in accordance with the embodiment of the present application and the conventional structure LED can be compared when they are used in a dimmable light light-emitting device. FIG. 10A and FIG. 10B show the light intensity versus wavelength charts of the two devices described above in FIG. 9 under different operating currents, wherein FIG. 10A and FIG. 10B show the conditions for light-emitting devices adopting the aforementioned LED in accordance with the embodiment of the present application and the conventional structure LED, respectively. The relation between light intensity and wavelength can be measured by a monochromator. It can be seen in FIG. 10A and FIG. 10B that for both the aforementioned LED in accordance with the embodiment of the present application and the conventional structure LED, the light intensity increases as the operating current increases. However, as mentioned above, the structure in accordance with the embodiment of the present application solves the efficiency droop problem, and accordingly it has a better light intensity of 52 (a.u.), which is higher than the light intensity of the conventional structure blue LED, which is only 50 (a.u.), under the high operating current, as the condition of the current of 1000 mA in the figure shows. It is noted that for a specific operating current, the color temperature value can be obtained through an integration of the light intensity multiplied by the sensitivity coefficient of the human eyes with respect to the wavelength. And the color temperature values for different operating currents can be obtained, which is as the color temperature trend under different operating current densities shown above in FIG. 9. The color temperature of the light-emitting device having a combination of the blue LED in accordance with the embodiment of the present application and a red LED element ranges between 2000K and 5000K. It can be seen in FIG. 9 that under a high operating current condition, for example, when the current density is greater than 20 A/cm$^2$ (when the current is greater than 350 mA for a 45 mil*45 mil chip), as the operating current density increases from 0.35 A/mm$^2$ to 1 A/mm$^2$, the color temperature of the light-emitting device having the combination of the conventional structure blue LED and the red LED rises from about 3610K to the maximum value of the color temperature of about 3670K, and then falls to 3530K, wherein (k), and the amount of the change in the color temperature is approximately 140K; in contrast, the color temperature of the light-emitting device having the combination of the blue LED having the structure in accordance with the embodiment of the present application and the identical red LED changes from about 3740K to 3820K, wherein the amount of the change in the color temperature is approximately only 80K. It is clear that because the blue LED in accordance with the embodiment of the present application solves the efficiency droop problem, it can alleviate the aforementioned color temperature shift phenomenon when being applied to a light-emitting device to combine with a red LED. The amount of the change in color temperature shift under a high operating current condition is less and smaller than about 100K. Besides, it avoids a shift trend toward cool light as the light-emitting device having the combination of the conventional structure blue LED and the red LED.

Figure 11:
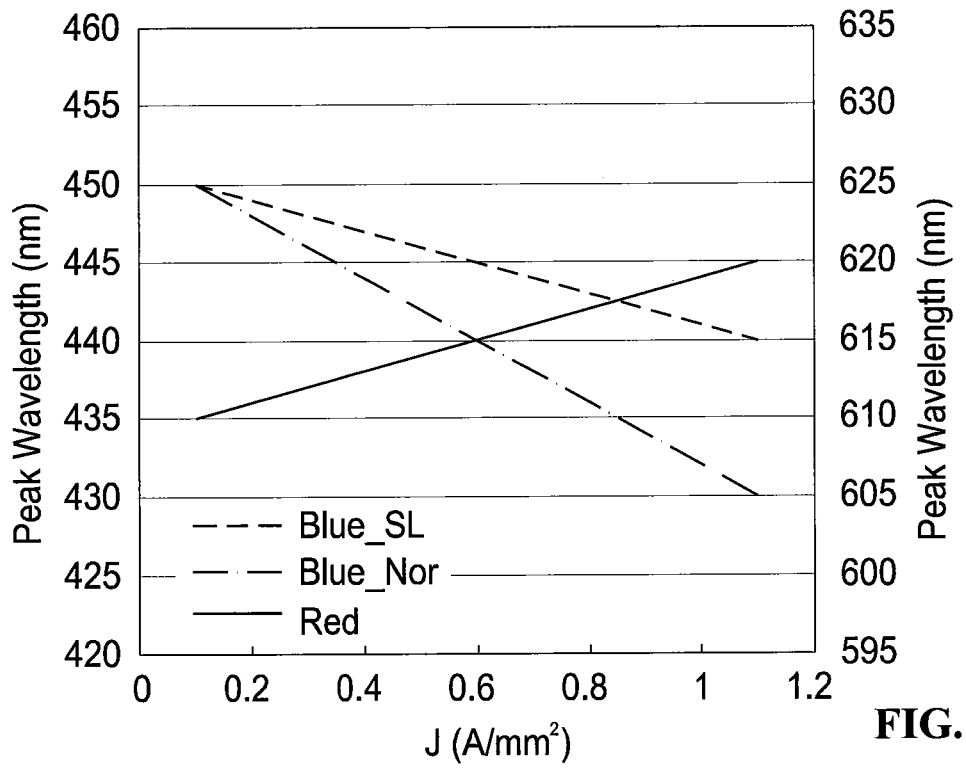
FIG. 11 shows the peak wavelength versus the operating current density chart of the blue LED having the structure in accordance with the embodiment of the present application, the conventional structure blue LED, and the red LED in FIG. 9 (or in FIG. 10A and FIG. 10B).

FIG. 11 shows the peak wavelength versus the operating current density chart of the blue LED having the structure in accordance with the embodiment of the present application (marked by Blue_SL), the conventional structure blue LED (marked by Blue_Nor), and the red LED (marked by "Red") mentioned previously in FIG. 9 (or in FIG. 10A and FIG. 10B). It can be seen in FIG. 11 that as the operating current density increases from 0.1 A/mm$^2$ to 1.1 A/mm$^2$, for both the two aforementioned blue LEDs, the peak wavelengths become shorter. However, the peak wavelength of the blue LED having the structure in accordance with the embodiment of the present application changes from about 450 nm to 440 nm, wherein the amount of the change in the peak wavelength is 10 nm. In contrast, the peak wavelength of the conventional structure blue LED changes from about 450 nm to 430 nm, wherein the amount of the change in the peak wavelength is 20 nm. The blue LED having the structure in accordance with the embodiment of the present application has a stabler performance in the light wavelength, which is also one advantage of the LED having the structure in accordance with the embodiment of the present application.

Figure 12:
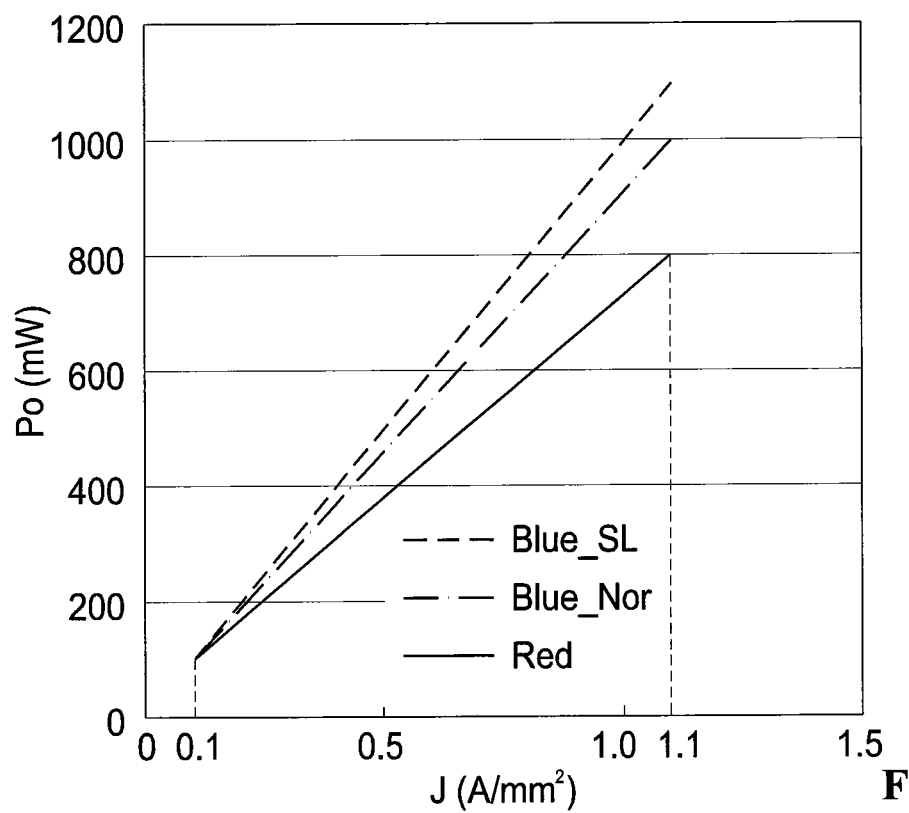
FIG. 12 shows the power versus the operating current density chart of the blue LED having the structure in accordance with the embodiment of the present application, the conventional structure blue LED, and the red LED in FIG. 9 (or in FIG. 10A and FIG. 10B).

FIG. 12 shows the power versus the operating current density chart of the blue LED having the structure in accordance with the embodiment of the present application (marked by Blue_SL), the conventional structure blue LED (marked by Blue_Nor), and the red LED (marked by "Red") mentioned previously in FIG. 9 (or in FIG. 10A and FIG. 10B). It can be seen in FIG. 12 that as the operating current density increases from 0.1 A/mm$^2$ to 1.1 A/mm$^2$, the power of both two aforementioned blue LEDs increases. However, the power of the blue LED having the structure in accordance with the embodiment of the present application has a better performance and is higher than that of the conventional structure blue LED.

The above-mentioned embodiments are only examples to illustrate the theory of the present invention and its effect, rather than be used to limit the present invention. Other alternatives and modifications may be made by a person of ordinary skill in the art of the present application without escaping the spirit and scope of the application, and are within the scope of the present application.

What is claimed is:

1. A light-emitting device, comprising:
    a first multi-quantum well structure comprising a plurality of first well layers and a first barrier layer stacked alternately, wherein the energy gap of the first barrier layer is larger than that of any one of the first well layers;
    a second multi-quantum well structure comprising a plurality of second well layers and a second barrier layer stacked alternately, wherein the energy gap of the second barrier layer is larger than that of any one of the second well layers;
    a third barrier layer disposed between the first multi-quantum well structure and the second multi-quantum well structure, and the third barrier layer connected with the first well layer and the second well layer, wherein the energy gap of the third barrier layer is larger than that of any one of the first well layers and the second well layers, and the thickness of the third barrier layer is larger than that of any one of the first barrier layer and the second barrier layer;
    a first semiconductor layer having a first conductivity type under the first multi-quantum well structure; and
    a set of first structures disposed between the first semiconductor layer and the first multi-quantum well structure, wherein the set of first structures comprises a third well layer and an un-doped or unintentionally-doped fourth barrier layer, and the energy gap of the third well layer is larger than any one of those of the first well layers and the second well layers.

2. The light-emitting device as claimed in claim 1, wherein the thickness of the first barrier layer and/or the second barrier layer is less than 5 nm, and the thickness of the third barrier layer is larger than or equal to 5 nm.

3. The light-emitting device as claimed in claim 1, wherein the number of the first well layers of the first multi-quantum well structure is different from the number of the second well layers of the second multi-quantum well structure.

4. The light-emitting device as claimed in claim 1, wherein the material of the first well layers and/or the second well layers is InGaN, and the material of the first barrier layer and/or the second barrier layer and/or the third barrier layer is GaN.

5. The light-emitting device as claimed in claim 1, further comprising:
    a second semiconductor layer having a second conductivity type over the second multi-quantum well structure.

6. The light-emitting device as claimed in claim 5, further comprising a set of second structures disposed between the first semiconductor layer and the first multi-quantum well structure, wherein the set of second structures comprises a fourth well layer and a fifth barrier layer, and one of the fourth well layer and the fifth barrier layer has a first conductivity type, and the energy gap of the fourth well layer is larger than any one of those of the first well layers and the second well layers.

7. The light-emitting device as claimed in claim 6, wherein the energy gap of the fifth barrier layer is larger than that of the fourth well layer.

8. The light-emitting device as claimed in claim 5, wherein the first conductivity type is n-type, and the thickness of the first barrier layer and/or the second barrier layer closer to the first semiconductor layer is larger than the thickness of the first barrier layer and/or the second barrier layer farther from the first semiconductor layer.

9. The light-emitting device as claimed in claim 1, further comprising a set of second structures disposed between the first semiconductor layer and the set of first structures, wherein the set of second structures comprises a fourth well layer and a fifth barrier layer, and one of the fourth well layer and the fifth barrier layer has a first conductivity type, and the energy gap of the fourth well layer is larger than any one of those of the first well layers and the second well layers.

10. The light-emitting device as claimed in claim 9, wherein the material of the third well layer and/or the fourth well layer is InGaN, and the material of the fourth barrier layer and/or the fifth barrier layer is GaN.

11. The light-emitting device as claimed in claim 1, wherein the energy gap of the fourth barrier layer is larger than that of the third well layer.

12. The light-emitting device as claimed in claim 1, wherein as an operating current density of the light-emitting device increases from 0.1 A/mm$^2$ to 1.1 A/mm$^2$, an amount of the change in a peak wavelength of the light-emitting device is equal to or less than 10 nm.

13. A light-emitting device, comprising:
a first light-emitting device of claim 1 to emit a light of a first color;
a phosphor on the first light-emitting device, wherein a part of the light of the first color passes through the phosphor, and another part of the light of the first color is absorbed by the phosphor to excite the phosphor to generate an excited light; and
a second light-emitting device to emit a light of a second color, wherein the light of the first color passing through the phosphor, the light of the second color, and the excited light are mixed to form a white light, and wherein as an operating current density of the first light-emitting device increases from 0.1 A/mm$^2$ to 1.1 A/mm$^2$, an amount of the change in a peak wavelength of the first light-emitting device is equal to or less than 10 nm.

14. The light-emitting device as claimed in claim 13, wherein the white light has a color temperature, and when the operating current density of the first light-emitting device and an operating current density of the second light-emitting device increase from 0.35 A/mm$^2$ to 1 A/mm$^2$, the amount of the change in the color temperature is smaller than 100K.

15. The light-emitting device as claimed in claim 13, wherein the white light has a color temperature ranging between 2000K and 5000K.

16. The light-emitting device as claimed in claim 13, wherein when the operating current density of the first light-emitting element device is 20 A/cm$^2$, a device efficiency of the first light-emitting device is larger than 20%, and a declining rate of the first light-emitting device from a maximum device efficiency to the device efficiency at the current density of 75 A/cm$^2$ is smaller than 30%.

17. The light-emitting device as claimed in claim 13, wherein when the operating current density of the first light-emitting device is 20 A/cm$^2$, an internal quantum efficiency of the first light-emitting device is larger than 30%, and a declining rate of the first light-emitting device from a maximum internal quantum efficiency to the internal quantum efficiency at the current density of 75 A/cm$^2$ is smaller than 30%.

18. The light-emitting device as claimed in claim 13, wherein the first light-emitting device comprises GaN-based material, and the second light-emitting device comprises GaP-based material.

19. The light-emitting device as claimed in claim 13, wherein the phosphor comprises a yellow phosphor.

* * * * *